United States Patent [19]

Diaz

[11] 3,800,169

[45] Mar. 26, 1974

[54] TIMING CIRCUIT INCLUDING TEMPERATURE COMPENSATION

[75] Inventor: Wilfredo Diaz, New York, N.Y.

[73] Assignee: Bell Telephone Laboratories, Incorporated, Murray Hill, N.J.

[22] Filed: Nov. 22, 1972

[21] Appl. No.: 308,663

[52] U.S. Cl. .................. 307/310, 307/265, 307/293, 330/23

[51] Int. Cl. .................................... H03k 19/14

[58] Field of Search ........... 307/280, 293, 300, 310, 307/265; 330/23

[56] References Cited

UNITED STATES PATENTS

| | | | |
|---|---|---|---|
| 3,359,430 | 12/1967 | Jones | 307/280 |
| 3,473,048 | 10/1969 | Winn | 307/310 |
| 3,302,124 | 1/1967 | Dix | 330/23 |
| 3,452,281 | 6/1969 | Weischedel | 330/23 |
| 3,566,293 | 2/1971 | Von Recklinghausen | 330/23 |
| 3,571,735 | 3/1971 | Ducamus | 307/310 |
| 3,636,384 | 1/1972 | DeWitt | 330/23 |

OTHER PUBLICATIONS

Fairchild Semiconductor Data Sheet for TTμL 9601 CTD Apr. 1968, Page 4.

*Primary Examiner*—Stanley D. Miller, Jr.
*Attorney, Agent, or Firm*—T. Stafford

[57] ABSTRACT

Pulse signals having desired time intervals are generated, in part, by employing a resistor-capacitor series circuit. The potential developed across the capacitor drives a transistor emitter-follower amplifier. Variations in the signal developed at the emitter-follower output and, hence, in the pulse signals derived from that output are caused by variations in the transistor base-to-emitter potential because of changes in temperature. These variations are minimized by employing a diode to "clamp" the potential applied to the RC series circuit so that it varies substantially as the base-to-emitter potential.

7 Claims, 2 Drawing Figures

TIMING CIRCUIT INCLUDING TEMPERATURE COMPENSATION

BACKGROUND OF THE INVENTION

This invention relates to circuits for generating pulse signals having precise time intervals and, more particularly, to circuits for generating timing pulse signals including compensation for circuit variations caused by temperature changes.

Numerous circuit arrangements have been employed to generate pulse signals having precise time intervals. One of the most well-known arrangements is the resistor-capacitor series circuit utilized for controlling the time interval of such pulse signals. In modern circuits, it is both desirable and necessary that the capacitor employed in such a timing circuit be small in size. This requirement generally dictates that the capacitance value is also small. It follows that in order to obtain relatively long time intervals, a resistor having a large resistance value must be utilized. Use of a large resistance value coupled with limited source voltage level availability limits the magnitude of current being supplied for charging the capacitor to a low value. Thus, any drain of the charging current to drive output circuits and the like affects the capacitor charge rate and, hence, causes errors in the time interval of the resultant pulse signals.

Amplifiers are used to minimize loading upon the capacitor during the charging interval to insure accuracy of the resultant timing pulses. Generally, a transistor emitter-follower stage is employed to minimize circuit loading. Such transistor amplifiers, however, are sources of possible errors in the time interval of the desired pulse signals. The transistor used to minimize loading of the capacitor is usually arranged so that the base-to-emitter junction is effectively connected in parallel with the timing circuit capacitor. Consequently, the capacitor is charged to an initial value equal to the potential developed across the base-to-emitter junction of the transistor. As is well known in the art, the base-to-emitter potential of a transistor varies substantially with changes in temperature. Thus, the value of the initial charge on the capacitor also varies with temperature. Since the magnitude of the voltage supplied to the timing circuit is substantially constant, the variations in initial charge cause the rate of charging the capacitor to vary. In turn, the variations with temperature in the rate of charging the capacitor cause variations in the time interval of the resultant timing pulses.

SUMMARY OF THE INVENTION

These and other problems are resolved in accordance with the inventive principles described herein in a resistor-capacitor (RC) timing circuit including a transistor amplifier stage by compensating for changes in the transistor base-to-emitter potential caused by variations in temperature. This compensation is achieved, in accordance with the invention, by employing a temperature variant element for controlling the magnitude of a direct current potential applied to the RC circuit to vary substantially as the transistor base-to-emitter potential.

More specifically, a timing circuit including a temperature compensation arrangement, in accordance with the invention, includes a resistor-capacitor series circuit for generating a ramp signal utilized in generating pulse signals having precise time intervals. The potential developed across the capacitor is supplied to the base terminal of a transistor connected in an emitter-follower amplifier configuration. A first voltage source is connected via a load resistor to the collector terminal of the transistor. A second voltage source for supplying a potential having a magnitude greater than the magnitude of the potential supplied from the first source is connected via a supply resistor to the RC series circuit. The output of the emitter-follower transistor amplifier is supplied to a utilization means which, for example, may be a multivibrator, for generating pulse signals having desired time intervals.

Variations in the emitter-follower output waveform and, hence, in the time interval of pulse signals derived from that output are caused by changes in the transistor base-to-emitter potential caused by changes in temperature. These variations are minimized, in accordance with the invention, by utilizing a temperature variant element to "clamp" the magnitude of the potential supplied to the RC series circuit so that it varies with temperature substantially as the transistor base-to-emitter potential. That is to say, the incremental variation in the magnitude of the potential supplied to the RC series circuit is substantially equal to the variation in the transistor base-to-emitter potential. This is achieved by connecting the temperature variant element which, for example, may be at least one semiconductor diode or the like, in circuit between the first voltage source and the input to the RC series circuit. The temperature variant element is poled so that the magnitude of the potential being supplied to the RC circuit is greater than the magnitude of the potential supplied from the first source and so that the magnitude of the potential supplied to the RC circuit varies with temperature substantially as the magnitude of the transistor base-to-emitter potential.

BRIEF DESCRIPTION OF THE DRAWINGS

These and other objects and advantages of the invention will be more fully understood from the following detailed description of an illustrative embodiment thereof taken in connection with the appended drawings in which.

DETAILED DESCRIPTION

Figure 1:
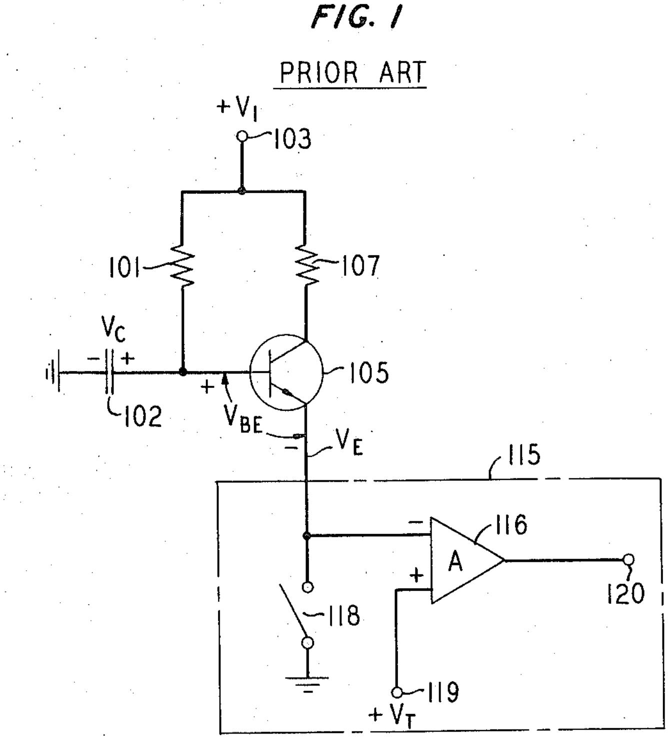
FIG. 1 PRIOR ART
FIG. 1 shows a prior known timing circuit useful in describing the invention.

FIG. 1 shows a prior known timing circuit arrangement including resistor 101 connected in series with capacitor 102. A direct current (dc) potential having a desired magnitude $V_1$, is supplied via terminal 103 to resistor 101 and, hence, to capacitor 102. As is well known, potential $V_C$ developed across capacitor 102 increases exponentially with time and has a slope dependent, in part, upon the component values of resistor 101 and capacitor 102, namely, the RC time constant.

In modern circuits it is desirable that capacitor 102 have relatively small physical dimensions. Ordinarily, this dictates that the capacitance value of capacitor 102 is also small. Accordingly, in order to obtain relatively long time constants the resistance value of resistor 101 must be large. Since most systems in which such timing circuits are utilized usually have a limited number of supply voltage magnitudes available and since large resistance values must be employed to obtain long time constants the magnitude of current supplied to capacitor 101 must necessarily have a low initial value. It is readily seen, therefore, that any drain on the current being supplied to capacitor 102 causes a variation in the slope of potential $V_C$ developed across capacitor 102. The time interval of pulse signals derived from potential $V_C$ is directly related to the slope of that potential, namely, the time interval required for potential $V_C$ to reach a predetermined magnitude. Thus, variations in the slope of potential $V_C$ cause variations in the time interval of resultant pulse signals.

Such errors resulting from loading on capacitor 102 are minimized by employing transistor 105 in an emitter-follower amplifier arrangement. Accordingly, potential $V_C$ developed across capacitor 102 is supplied to the base terminal of transistor 105. Bias current is supplied from potential source $V_1$ via terminal 103 and load resistor 107 to the collector terminal of transistor 105. Output waveform $V_E$ generated at the emitter terminal of transistor 105, in response to potential $V_C$ developed across capacitor 102, is supplied to utilization means 115 to be utilized as desired.

A circuit arrangement substantially identical to that described above is shown on page 4 of a Fairchild Semiconductor data sheet for TT$\mu$L 9601 dated April 1968.

Utilization means 115 may be any one of numerous circuit arrangements which utilize remote or external timing circuits to generate pulse signals or the like having precise time intervals. For purposes of illustration, in this example, differential amplifier 116 is employed to generate pulse signals having desired time intervals. To this end, waveform $V_E$ developed at the emitter terminal of transistor 105 is supplied to one input of amplifier 116 and to one terminal of switching element 118. A second terminal of switching element 118 is connected to a reference potential point, namely, ground potential. A desired threshold potential, $V_T$, is supplied via terminal 119 to a second input of amplifier 116. Threshold potential $V_T$ has a magnitude determined in accordance with the time interval of the pulse signal being generated. For example, as the magnitude of $V_T$ is increased toward the maximum value of $V_E$ the time interval is increased of pulse signals developed at output 120 of an amplifier 116.

Generation of a pulse signal having a desired time interval is initiated by momentarily closing switching element 118. The magnitude of potential $V_E$ prior to closing switch 118 is equal to the maximum potential developed across capacitor 102 $V_C$max less potential $V_{BE}$. This value of $V_E$ is greater than the magnitude of threshold potential $V_T$. Accordingly, the output potential developed at 120 prior to closing switch 118 is equal to the negative saturation output potential of amplifier 116. Upon closing switch 118, capacitor 102 is discharged and the magnitude of $V_E$ becomes equal to approximately 0. This drop in $V_E$ causes the potential developed at 120 to switch from the negative saturation output potential of amplifier 116 to the positive saturation output potential of amplifier 116. The output of amplifier 116 remains positive until the magnitude of potential $V_E$ becomes greater than the magnitude of potential $V_T$. Then, the output of amplifier 116 switches back to its negative saturation potential and a pulse signal having a desired timing interval has been generated.

As stated above, the time interval of the pulse signal generated at 120 is adjusted by varying the magnitude of potential $V_T$.

It can readily be shown that potential $V_E$ developed at the emitter terminal of transistor 105 (FIG. 1) is represented by $$V_E = (V_1 - V_{BE})\,(1 - e^{-t/RC}), \tag{1}$$

where $V_1$ is the supply voltage, $V_{BE}$ is the potential developed across the base-to-emitter junction of transistor 105, $R$ is the resistance value of resistor 101, $C$ is the capacitance value of capacitor 102, $e$ is approximately equal to 2.7183 and $t$ represents time elapsed from an initial starting point. From Equation 1 it is readily seen that the output of the prior art circuit of FIG. 1, namely potential $V_E$, is dependent on base-to-emitter potential $V_{BE}$. As is well known in the art, the magnitude of potential $V_{BE}$ varies substantially with changes in temperature. Thus, it follows that $V_E$ and, hence, the time intervals of pulse signals derived from $V_E$, must also vary with changes in temperature. Such variations with temperature cannot be tolerated in systems requiring precise timing intervals.

Figure 2:
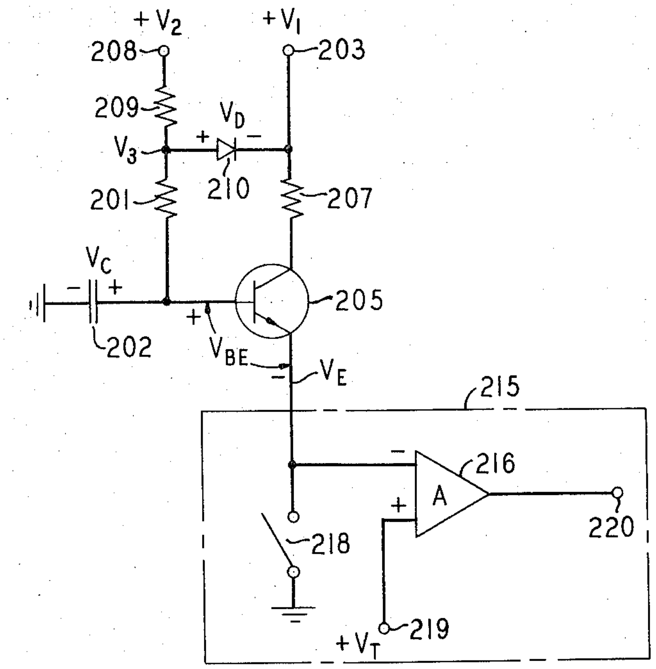
FIG. 2 shows a timing circuit illustrating the present invention.

FIG. 2 illustrates a pulse signal generating circuit which includes compensation, in accordance with the invention, for minimizing the effect of temperature variations on the time intervals of pulse signals being generated. Accordingly, there is shown a series RC timing circuit including resistor 201 connected in series with capacitor 202. As in the prior art circuit of FIG. 1, transistor 205 is employed to minimize loading of capacitor 202. Bias current is supplied from voltage source $V_1$ via terminal 203 and resistor 207 to the collector terminal of transistor 205. A charging current is supplied from potential source $V_2$ via terminal 208 and resistor 209 to the input of the RC timing circuit, i.e., to resistor 201.

Potential $V_E$ developed at the emitter terminal of transistor 205, in response to potential $V_C$ developed across capacitor 202, is supplied to utilization means 215 for generating pulse signals having time intervals as desired. As in the prior art circuit of FIG. 1, utilization means 215 including differential amplifier 216, reference potential source $V_T$ and switching element 218 is employed to develop pulse signals at terminal 220 having desired time intervals. Numerous other devices and arrangements known in the art may be equally employed to generate such signals, for example, multivibrators and the like.

Variations in potential $V_E$, developed at the emitter terminal of transistor 205, caused by variations in base-to-emitter potential $V_{BE}$ because of changes in temperature, are substantially minimized, in accordance with the invention, by employing a temperature variant element which, for example, is a unidirectional conductive element such as semiconductor diode 210. Diode 210 is utilized to clamp potential $V_3$ at the input of the RC timing circuit so that the magnitude of potential $V_3$ varies substantially as base-to-emitter potential $V_{BE}$ with changes in temperature. That is to say, the incremental variation in magnitude of potential $V_3$ with changes in temperature is substantially equal to the incremental change in the magnitude of potential $V_{BE}$. Diode 210 is poled so that the magnitude of potential $V_3$ is greater than the magnitude of potential $V_1$.

It is well known in the art that the potential developed across a diode is substantially equal to and varies substantially as the potential developed across the base-to-emitter junction of a transistor. Indeed, a substantially identical potential drop and potential variation with temperature as potential $V_{BE}$ may be obtained by connecting a transistor as a diode. Accordingly, a transistor connected as a diode may be utilized, in accordance with the invention, to maintain potential $V_3$ at a magnitude which has an incremental variation with temperature substantially equal to the incremental variation in base-to-emitter potential $V_{BE}$.

It can readily be shown that potential $V_E$ developed at the emitter terminal of transistor 205 during a charging interval of capacitor 202 is represented by $$V_E = V_1(1-e^{-t/RC}). \quad (2)$$

Accordingly, it is readily seen from Equation 2 that potential $V_E$ developed at the emitter terminal of transistor 205 is not dependent on base-to-emitter potential $V_{BE}$. Thus, the time interval of pulse signals derived from potential $V_E$ at terminal 220 of utilization means 215 are also free of errors which occur in prior art circuits because of variations in potential $V_{BE}$ caused by changes in temperature.

The above described arrangements are, of course, merely illustrative of an application of the principles of this invention. Numerous other arrangements may be devised by those skilled in the art without departing from the spirit and scope of the invention. For example, a P-N-P type transistor may be employed as the emitter-follower amplifier, thereby requiring the poling of the semiconductor diode clamping element to be reversed. In other applications it may prove desirable to employ a plurality of transistors connected in a Darlington arrangement for the emitter-follower amplifier. Then, an equal number of semiconductor diodes connected in series would be employed to obtain the necessary incremental magnitude variation with temperature of the potential applied to the RC timing circuit.

What is claimed is:

1. A timing circuit for generating pulse signals which comprises:

a transistor having base, emitter and collector terminals;

a first source of potential having a first magnitude;

first impedance means connected in circuit between said first source and said collector terminal;

resistor means;

capacitor means connected in series with said resistor means, a circuit point between said capacitor means and said resistor means being connected in circuit relationship with said base terminal;

a second source of potential having a second magnitude, said second magnitude being greater than said first magnitude;

second impedance means connected in circuit between said second source and said series connection;

semiconductor means connected in circuit between said first potential source and a circuit point between said second impedance means and said series connection, said semiconductor means being arranged to maintain the magnitude of the potential supplied to said series connection at a value greater than the magnitude of said first potential and having an incremental variation with temperature substantially equal to the incremental variation with temperature of a potential developed across the base-to-emitter terminals of said transistor, thereby compensating for variations caused by temperature changes in an initial charge developed on said capacitor means; and utilization means in circuit with the emitter terminal of said transistor and being responsive to a potential developed at said emitter terminal representative of the charge developed on said capacitor means for generating pulse signals having precise intervals representative of the time interval between the occurrence of predetermined amplitude values of the potential being developed at said emitter terminal, wherein the time interval of said pulse signals is substantially constant with variations in temperature.

2. A circuit as defined in claim 1 wherein said semiconductor means includes unidirectional conductive means which is poled so that the magnitude of the potential applied to said series circuit is maintained at a magnitude greater than the magnitude of said first potential.

3. A circuit is defined in claim 2 wherein said unidirectional conductive means includes at least one semiconductor diode, said diode being poled so that the magnitude of the potential developed at said circuit point is greater than the magnitude of said first potential.

4. A circuit as defined in claim 3 wherein said capacitor means has first and second terminals, said first terminal being connected in circuit with said base terminal and said second terminal being connected to a reference potential point, and wherein said resistor means has first and second terminals said first terminal being connected in circuit with said second impedance means and said at least one diode and said second terminal being connected in circuit with said base terminal.

5. A circuit as defined in claim 4 wherein said utilization means includes controllable means for initiating a charging cycle of said capacitor means for generating one of said pulse signals.

6. A circuit for generating timing pulse signals which comprises:

at least one transistor having base, emitter and collector terminals;

a first source of direct current potential having a first magnitude;

first resistor means having a predetermined resistance value connected in circuit between said first potential source and said collector terminal;

capacitor means having a predetermined capacitance value and first and second terminals, said first terminal being connected in circuit relationship with said base terminal and said second terminal being connected in circuit with a reference potential point;

second resistor means having a predetermined resistance value and first and second terminals, said first terminal being connected in circuit relationship with the first terminal of said capacitor means, said capacitor means and said second resistor means forming a series RC circuit;

a second source of direct current potential having a second magnitude, said second magnitude being greater than the magnitude of said first potential;

third resistor means having a predetermined resistance value connected in circuit between said second potential source and the second terminal of said second resistor means;

at least one semiconductor means connected in circuit between said first potential source and the second terminal of said second resistor means, said at least one semiconductor means being arranged so that the magnitude of the potential developed at the second terminal of said second resistor means and being supplied to said series RC circuit is greater than the magnitude of said first potential and has an incremental variation with temperature sub-stantially equal to the incremental variation with tem-perature in the magnitude of a potential developed across the base-to-emitter terminals of said at least one transistor; and utilization means in circuit with the emitter terminal of said transistor and being responsive to a potential developed at said emitter terminal representative of the charge developed in said capacitor means for generating pulse signals having precise intervals repre-sentative of the time interval between the occurrence of predetermined amplitude values of the potential being developed at said emitter terminal, wherein the time interval of said pulse signals is substantially constant with variations in temperature.

7. A circuit as defined in claim 6 wherein said at least one semiconductor means includes at least one semiconductor diode, said semiconductor diode being of a type having substantially identical characteristics as the base-to-emitter junction of said at least one transistor and being poled so that the magnitude of the potential developed at the second terminal of said second resistor means is greater than the magnitude of said first potential.

* * * * *